United States Patent [19]

Maeno

[11] Patent Number: 4,926,424
[45] Date of Patent: May 15, 1990

[54] TEST AUXILIARY CIRCUIT FOR TESTING SEMICONDUCTOR DEVICE

[75] Inventor: Hideshi Maeno, Hyogo, Japan

[73] Assignee: Mitsubishi Denki Kabushiki Kaisha, Tokyo, Japan

[21] Appl. No.: 207,919

[22] Filed: Jun. 10, 1988

[30] Foreign Application Priority Data

Jun. 11, 1987 [JP] Japan ................. 62-146622

[51] Int. Cl.$^5$ ............................... G01R 31/28
[52] U.S. Cl. .................... 371/22.3; 371/21.2
[58] Field of Search ........... 371/25, 15, 21, 22.3, 371/25.1, 15.1, 21.2; 324/73 R, 73 AT; 365/201

[56] References Cited

U.S. PATENT DOCUMENTS

| 4,601,034 | 7/1986 | Sridhar | 371/25 |
| 4,698,830 | 10/1987 | Barzilai | 371/25 X |
| 4,761,768 | 8/1988 | Turner | 371/25 X |

OTHER PUBLICATIONS

1985 Internation Test Conference: "A New Parallel Test Approach for Large Memories" by a R. Sridhar, paper No. 13.5, 1985, pp. 462–470.

*Primary Examiner*—Jerry Smith
*Assistant Examiner*—Robert W. Beausoliel
*Attorney, Agent, or Firm*—Lowe, Price, Le Blanc, Becker & Shur

[57] ABSTRACT

A scan-path comprises a plurality of scan registers connected in series. Expected value data are inputted to the plurality of scan registers by a serial shift operation. Data read out from a RAM which is a circuit under test are applied to parallel input terminals of the scan registers, respectively. If the data applied to the parallel input terminals are different from the expected value data, the data held in the scan registers are inverted. After data of all addresses in the RAM are read out, the data held in the scan registers are read out by the serial shift operation. If any of the data as read out is inverted, it is determined that the RAM is defective.

12 Claims, 7 Drawing Sheets

TEST AUXILIARY CIRCUIT FOR TESTING SEMICONDUCTOR DEVICE

BACKGROUND OF THE INVENTION

1. Field of the Invention

The present invention relates generally to test auxiliary circuits, and more particularly, to test auxiliary circuits employed for testing semiconductor memory devices.

2. Description of the Prior Art

FIG. 1 is a diagram showing structure of a conventional scan-path used as a test auxiliary circuit for performing operation tests of a semiconductor device such as a RAM (Random Access Memory).

The scan-path comprises n scan registers 14 connected in series. Each of the scan registers 14 comprises a first clock terminal 5, a second clock terminal 6, a selector control terminal 8, a serial input terminal 9, a parallel input terminal 10, a parallel output terminal 11 and a serial output terminal 12. The serial output terminal 12 of each of the scan registers 14 is connected to the serial input terminal 9 of an adjacent scan register 14. The selector control terminals 8 of the n scan registers 14 are connected to each other to receive a common select signal SEL. The first clock terminals 5 and the second clock terminals 6 of the scan registers 14 are connected to each other to receive a common first clock signal CK1 and a common second clock signal CK2, respectively.

The scan-path performs a serial shift operation or a parallel shift operation in response to the select signal SEL. When the serial shift operation is selected by the select signal SEL, data SI applied to the serial input terminal 9 of the scan register 14 in the first stage (shown at the left end in FIG. 1) is sequentially shifted to the scan registers 14 in the subsequent stages in synchronzation with the first and second clock signals CK1 and CK2 (a two-phase clock), to be sequentially outputted as serial output data SO from the serial output terminal 12 of the scan register 14 in the final stage (as shown at the right end in FIG. 1). On the other hand, when the parallel shift operation is selected by the select signal SEL, data PI applied to the parallel input terminals 10 are latched in the scan registers 14 in synchronization with the first and second clock signals CK1 and CK2, and outputted from the parallel output terminals 11.

In general, the scan-paths are connected to input terminals and output terminals of a circuit under test, respectively. Test data can be shifted in the scan-path connected to the input terminals of the circuit under test from the serial input terminal 9 by the serial shift operation and then, inputted to the circuit under test from the parallel output terminals 11 by the parallel shift operation. In addition, response data corresponding to the test data, obtained by the circuit under test can be accepted in the scan-path connected to the output terminals of the circuit under test from the parallel input terminals 10 by the parallel shift operation and then, derived from the serial output terminal 12 by the serial shift operation. In an example shown in FIG. 1, external pins required for testing are only five pins of the first and second clock terminals 5 and 6, the selector control terminal 8, the serial input terminal 9 and the serial output terminal 12. Thus, in a system employing a scan-path, if the number n of scan registers is large, the number of external pins required for testing can be reduced, as compared with a system in which parallel data is directly drawn out to the external pins. Therefore, the scan-path is employed as a test auxiliary circuit.

FIG. 2 is a diagram showing circuit structure of each of the scan registers 14 in the scan-path shown in FIG. 1.

The scan register 14 comprises a first latch circuit 1a, a second latch circuit 1b and a selector circuit 7, and operates by a two-phase clock. The selector circuit 7 has a first input terminal a connected to a serial input terminal 9, a second input terminal b connected to a parallel input terminal 10, a control terminal c connected to a selector control terminal 8 and an output terminal d. The first latch circuit 1a has an input terminal D connected to the output terminal d of the selector circuit 7, an enable terminal EN connected to a first clock terminal 5 and an output terminal Q. The second latch circuit 1b has an input terminal D connected to the output terminal Q of the first latch circuit 1a, an enable terminal EN connected to a second clock terminal 6 and an output terminal Q connected to a parallel output terminal 11 and a serial output terminal 12. Either one of the serial input terminal 9 and the parallel input terminal 10 is selected in response to a select signal SEL, so that data in the selected input terminal is applied to the input terminal D of the first circuit 1a through the output terminal d. Data applied to the input terminal D is latched in the latch circuit 1a in response to a first clock signal CK1, and outputted from the output terminal Q. Thereafter, the data latched in the first latch circuit 1a is latched in the second latch circuit 1b in response to a second clock signal CK2, and outputted from the output terminal Q.

Thus, the two-phase clock is applied to the first and second clock terminals 5 and 6, so that data applied to the serial input terminal 9 or the parallel input terminal 10 can be transferred to the serial output terminal 12 and the parallel output terminal 11, whereby a 1-bit shift operation is performed.

Thus, n scan registers 15 shown in FIG. 1 are connected in series, thereby forming a scan-path.

FIG. 3 is a circuit diagram showing another example of the conventional scan-path employed as a test auxiliary circuit.

The scan-path comprises n scan registers 15 connected in series. Each of the scan registers 15 comprises a parallel clock terminal 5a, a serial clock terminal 5b, a second clock terminal 6, a serial input terminal 9, a parallel input terminal 10, a parallel output terminal 11 and a serial output terminal 12. The serial output terminal 12 of each of the scan registers 15 is connected to the serial input terminal 9 of an adjacent scan register 15. The parallel clock terminals 5a of the n scan registers 15 are connected to each other to receive a common parallel clock signal PCK1, and the serial clock terminals 5b thereof are connected to each other to receive a common serial clock signal SCK1. In addition, the second clock terminals 6 of the scan registers 15 are connected to each other to receive a common second clock signal CK2. The scan-path performs a parallel shift operation when the clock signal PCK1 is applied to the parallel clock terminals 5a while performing a serial shift operation when the clock signal SCK1 is applied to the serial clock terminals 5b.

FIG. 4 is a diagram showing circuit structure of each of the scan registers 15 in the scan-path shown in FIG. 3.

The scan register 15 is formed by an MOS circuit, which comprises a first ratio-type latch circuit 1c, a second ratio-type latch circuit 1d and three N channel transistors 13a, 13b and 13c. Each of the first and second ratio-type latch circuits 1c and 1d comprises two NOT circuits. An input terminal p of the ratio-type latch circuit 1c is connected to a parallel input terminal 10 through the transistor 13a, and to a serial input terminal 9 through the transistor 13b. The transistor 13a has its gate connected to a parallel clock terminal 5a, and the transistor 13b has its gate connected to a serial clock terminal 5b. The transistor 13c is connected between an output terminal q of the ratio-type latch circuit 1c and an input terminal p of the second ratio-type latch circuit 1d, and has its gate connected to a second clock terminal 6.

When a clock signal PCK1 is applied to the parallel clock terminal 5a, the transistor 13a is turned-on, so that data PI applied to the parallel input terminal 10 is latched in the first ratio-type latch circuit 1c. Contrary to this, when a clock signal SCK1 is applied to the serial clock terminal 5b, the transistor 13b is turned on, so that data SI applied to the serial input terminal 9 is latched in the first ratio-type latch circuit 1c. This operation corresponds to a latch operation by the select signal SEL and the first clock signal CK1 in the scan register 14 shown in FIG. 2. Thus, data applied to the selected one of the parallel input terminal 10 and the serial input terminal 9 can be latched. Thereafter, when a second clock signal CK2 is applied to the second clock terminal 6, data latched in the first ratio-type latch circuit 1c is latched in the second ratio-type latch circuit 1d, and outputted to a parallel output terminal 11 and a serial output terminal 12.

Thus, a two-phase clock is applied to the parallel clock terminal 5a and the second clock terminal 6 or the serial clock terminal 5b and the second clock terminal 6, so that data applied to the parallel input terminal 10 or the serial input terminal 9 can be transferred to the parallel output terminal 11 and the serial output terminal 12, whereby a 1-bit shift operation can be performed. Thus, n scan registers 15 are connected in series, thereby forming the scan-path shown in FIG. 3.

FIG. 5 is a diagram showing an example of a case in which a scan-path is connected to a data output terminal of a RAM. In this case, a circuit under test is the RAM.

The scan-path comprises n scan registers 16 connected in series. Each of the scan registers 16 corresponds to each of the scan registers 14 or each of the scan registers 15 shown in FIGS. 1 to 4. A RAM 17 has n data output terminals 18. A parallel input terminal 10 of each of the scan registers 16 is connected to a corresponding data output terminal 18 of the RAM 17. In general, the scan-path is formed on the same semiconductor chip as that on which the RAM 17 is formed.

In general, when tests of the RAM are performed, data "0" or "1" are written to all addresses in the RAM and the data as written are read out. For example, data "0" are written to all addresses in the RAM 17 and the data as written are read out from all the addresses. Then, data "1" are written to all addresses in the RAM and the data as written are read out from all the addresses. If all of the data as written and the data as read out coincide with each other, it is determined that the RAM is an acceptable or nodefective product. Contrary to this, if any of the data as written and the data as read out do not coincide with each other, it is determined that the RAM is a defective product. In FIG. 5, the scan-path is employed for reading out data in the RAM 17 at the time of the above described tests.

Output data $Q_1$ to $Q_n$ from the data output terminals 18 of the RAM 17 are accepted in the scan-path from parallel input terminals 10 by a parallel shift operation while being read out bit by bit from a serial output terminal 12 by a serial shift operation. Quality is determined by a testing device in response to the data as read out. This operation is performed with respect to all the addresses.

In the above described conventional test auxiliary circuit, even when data "0" or "1" are continuously read out as at the time of testing the RAM, a serial shift operation must be performed for every one read operation. Therefore, if the number of bits of data is large, i.e., n is large, the test time is increased.

SUMMARY OF THE INVENTION

An object of the present invention is to reduce the test time of a circuit under test in which data "0" or "1" are continuously read out.

Another object of the present invention is to provide a test auxiliary circuit in which tests of the above described circuit under test can be performed by a small number of times of serial shift operations.

Still another object of the present invention is to provide at low cost a semiconductor device comprising a test auxiliary circuit in which tests can be performed in a short time.

In order to attain the above described objects, the test auxiliary circuit employed for testing a semiconductor device comprises a plurality of data holding means, a plurality of parallel data input terminals, a serial data input terminal, and a serial data output terminal. The plurality of data holding means are connected in series and each can hold data. The plurality of parallel data input terminals are provided corresponding to the plurality of data holding means and each coupled to each of the data holding means. The serial data input terminal is coupled to data holding means in the first stage, of the plurality of data holding means. The serial data output terminal is coupled to the data holding means in the final stage, of the plurality of data holding means. In addition, each of the data holding means can transfer the data held therein to the data holding means in the subsequent stages, and holds data applied to a corresponding one of the parallel data input terminals in place of the data held therein if the data applied to the parallel data input terminal is different from the data held therein.

In accordance with another aspect of the present invention, a testing method comprises the following steps: Expected value data to be outputted from the semiconductor device if the semiconductor device is normal is serially inputted to the plurality of data holding means from the serial data input terminal to be held therein. The data outputted from the semiconductor device is applied to the plurality of parallel data input terminals. If the data applied to each of the parallel data input terminals is different from the expected value data held in each of the data holding means, data applied to the parallel data input terminal is held in place of the expected value data. After all data are outputted from the semiconductor device, the data held in the plurality of data holding means are outputted from the serial data output terminal.

In the test auxiliary circuit according to the present invention, when data outputted from the circuit under test are applied to the parallel data input terminals with the expected value data being held in each of the data holding means, the data held by the holding means is inverted if the data is different from the expected value data. When the data held in the plurality of data holding means are read out from the serial data output terminal by a serial shift operation after all the data in the circuit under test are outputted, it can be determined whether the circuit under test is good or bad depending on whether or not any of the expected value data is inverted.

Thus, the serial shift operation need not be performed every time the data is outputted from the circuit under test.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
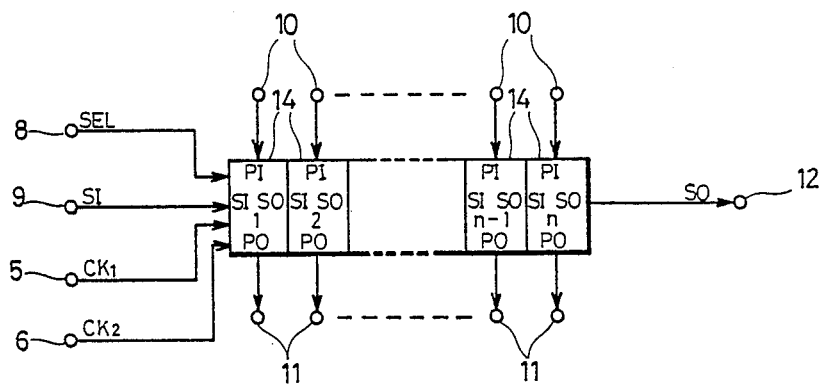
FIG. 1 is a diagram showing an example of a conventional scan-path employed as a test auxiliary circuit.

Referring now to the drawings, embodiments of the present invention will be described.

Figure 6:
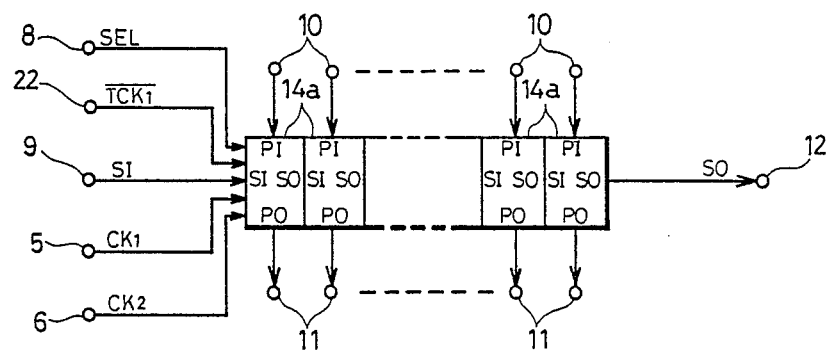
FIG. 6 is a diagram showing a scan-path employed as a test auxiliary circuit, according to an embodiment of the present invention.

FIG. 6 is a diagram showing structure of a scan-path employed as a test auxiliary circuit, according to an embodiment of the present invention.

The scan-path comprises n scan registers 14 connected in series. Each of the scan registers 14a comprises a first clock terminal 5, a second clock terminal 6, a selector control terminal 8, a serial input terminal 9, a parallel input terminal 10, a parallel output terminal 11 and a serial output terminal 12, similarly to the scan register 14 shown in FIG. 1, and further comprises a test clock terminal 22. The serial output terminal 12 of the scan register 14a is connected to the serial input terminal 9 of an adjacent scan register 14a. The selector control terminals 8 of the n scan registers 14 are connected to each other, to receive a common select signal SEL. The first clock terminals 5 and the second clock terminals 6 of the scan registers 14a are connected to each other, respectively, to receive a common first clock signal CK1 and a common clock signal CK2, respectively. The test clock terminals 22 of the scan registers 14a are connected to each other, to receive a common clock test signal $\overline{TCK1}$.

Figure 7:
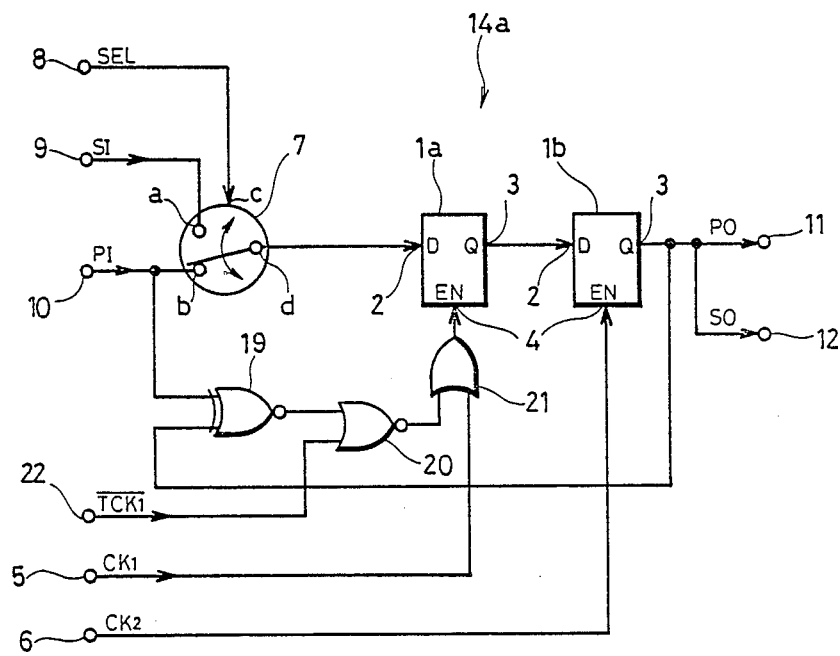
FIG. 7 is a circuit diagram showing structure of each of scan registers constituting the scan-path shown in FIG. 6.

Circuit structure of each of the scan registers 14a is illustrated in FIG. 7. The scan register 14a comprises a first latch circuit 1a, a second latch circuit 1b and a selector circuit 7, similar to the scan register 14 shown in FIG. 2, and further comprises an exclusive NOR (Ex. NOR) circuit 19, an NOR circuit 20 and an OR circuit 21.

Figure 2:
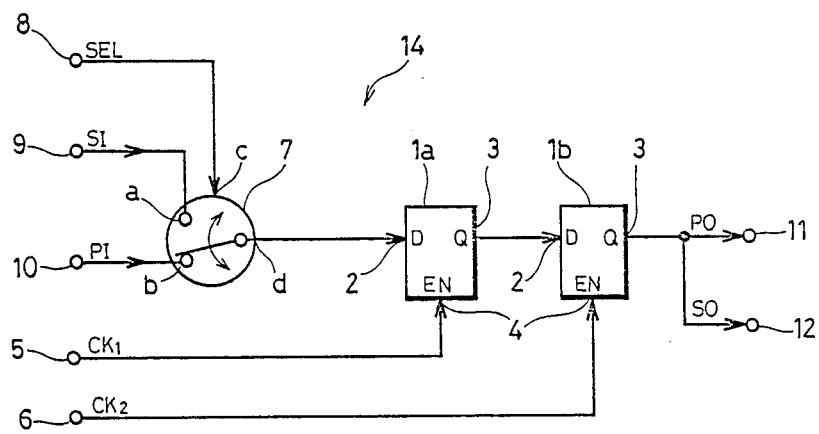
FIG. 2 is a circuit diagram showing structure of each of scan registers constituting the scan-path shown in FIG. 1.

The scan register 14a shown in FIG. 7 is the same as the scan register 14 shown in FIG. 2 except for the following. The same or corresponding portions have the same reference numerals. More specifically, the Ex.NOR circuit 19 has one input terminal connected to a parallel input terminal 10, another input terminal connected to an output terminal Q of the second latch circuit 1b, and an output terminal. The NOR circuit 20 has one input terminal connected to the output terminal of the Ex.NOR circuit 19, another input terminal connected to a test clock terminal 22, and an output terminal. An OR circuit 21 has one input terminal connected to the output terminal of the NOR circuit 20, another input terminal connected to a first clock terminal 5 and an output terminal connected to an enable terminal EN of the first latch circuit 1a.

Description is now made on an operation of the scan register 14a shown in FIG. 7. When a test clock signal $\overline{TCK1}$ is at a high level, the output of the NOR circuit 20 attains a low level, so that the OR circuit 21 directly transmits a first clock signal CK1 applied to the first clock terminal 5 to an enable terminal 4 of the latch circuit 1a. Thus, in this case, the scan register 14a performs the same operation as that of the conventional scan register 14 shown in FIG. 2. More specifically, either one of the serial input terminal 9 or the parallel input terminal 10 is selected in response to a select signal SEL, so that data in the selected input terminal is applied to an input terminal D of the first latch circuit 1a through an output terminal d. Data applied to the input terminal D is latched in the latch circuit 1a in response to a first clock signal CK1, and outputted from an output terminal Q. Thereafter, data latched in the first latch circuit 1a is latched in the second latch circuit 1b in response to a second clock signal CK2, and outputted from the output terminal Q.

At the time of testing a read operation of a circuit under test, the test clock signal $\overline{TCK1}$ is made to be a low level, and expected value data are set in the first and second latch circuits 1a and 1b. If data PI in the parallel input terminal 10 is different from the expected value data held in the second latch circuit 1b, the output of the Ex.NOR circuit 19 attains a low level. In this state, when a negative clock signal is applied to the test clock terminal 22, a positive clock signal is outputted from the NOR circuit 20. On this occassion, assuming that no clock signal is applied to the first clock terminal 5 (the first clock terminal 5 is fixed at a low level), the positive clock signal outputted from the NOR circuit 20 is added to the enable terminal EN of the first latch circuit 1a through the OR circuit 21. Consequently the data PI in the parallel input terminal 10 is latched in the first latch circuit 1a. Data opposite to the expected value data is latched in the first latch circuit 1a, thereby storing the fact that a failure has occurred in the circuit under test.

If the data PI in the parallel input terminal 10 is the same as the expected value data held in the second latch circuit 1b, the output of the Ex.NOR circuit 19 attains a high level. Consequently, the output of the NOR circuit 20 attains a low level, so that an output of the OR circuit 21 is fixed at a low level. Thus, the state of the first latch circuit 1a does not change.

Thus, if a negative clock signal is applied to the test clock terminal 22 with the expected value data being set in the first and second latch circuits 1a and 1b, the data PI in the parallel input terminal 10 is latched in the first latch circuit 1a so that the content stored therein is inverted only when the data PI is different from the expected value data.

Thus, when the test clock signal $\overline{TCK1}$ is at a high level, the scan-path shown in FIG. 6 comprising the scan register 14a shown in FIG. 7 performs the same operation as that of the conventional scan-path shown in FIG. 1. More specifically, the scan-path is responsive to the select signal SEL for performing a serial shift operation or a parallel shift operation in synchronization with the first and second clock signals CK1 and CK2 (a two-phase clock).

Additionally, if the test clock signal $\overline{TCK1}$ of a low level is applied to the test clock terminal 22 with the expected value data being set in the scan registers 14a in the scan-path shown in FIG. 6, data held in the scan registers 14a are inverted only when the data PI applied to each of the parallel input terminals 10 is different from the expected value data. Thus, the scan register 14a stores the fact that the data PI applied to the parallel input terminal 10 is different from the expected value data.

Figure 8:
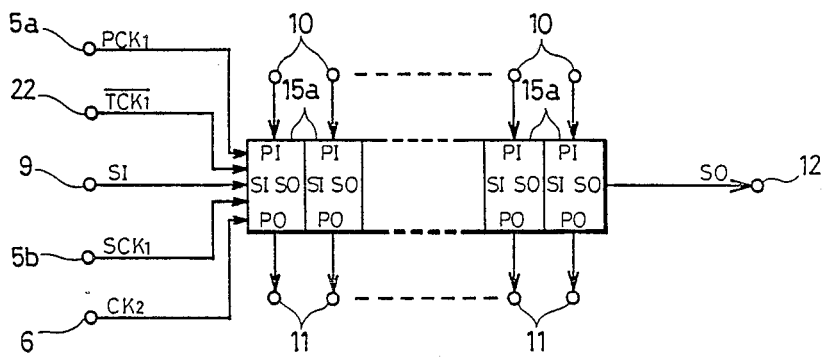
FIG. 8 is a diagram showing a scan-path employed as a test auxiliary circuit, according to another embodiment of the present invention.

FIG. 8 is a diagram showing structure of a scan-path employed as a test auxiliary circuit, according to another embodiment of the present invention.

The scan-path includes n scan registers 15a connected in series. Each of the scan registers 15a comprises a parallel clock terminal 5a, a serial clock terminal 5b, a second clock terminal 6, a serial input terminal 9, a parallel input terminal 10, a parallel output terminal 11 and a serial output terminal 12, similarly to the scan register 15 shown in FIG. 3, and further comprises a test clock terminal 22. The serial output terminal 12 of each of the scan registers 15a is connected to the serial input terminal 9 of an adjacent scan register 15. The parallel clock terminals 5a of the n scan registers 15 are connected to each other, to receive a common parallel clock signal PCK1, and the serial clock terminals 5b thereof are connected to each other, to receive a common serial clock signal SCK1. In addition, the second clock terminals 6 of the scan registers 15a are connected to each other, to receive a common second clock signal CK2. Furthermore, the test clock terminals 22 of the scan registers 15a are connected to each other, to receive a test clock signal $\overline{TCK1}$.

Figure 9:
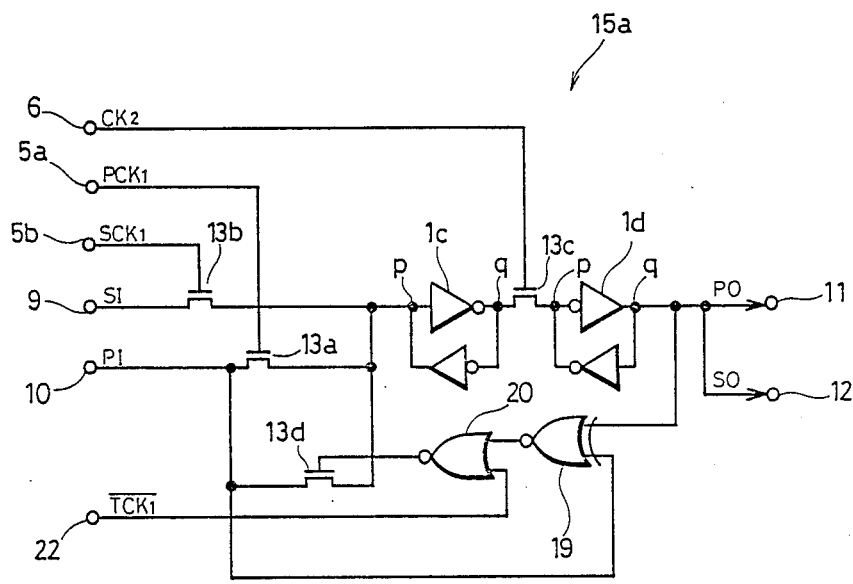
FIG. 9 is a circuit diagram showing structure of each of scan registers constituting the scan-path shown in FIG. 8.

Circuit structure of each of the scan registers 15a is illustrated in FIG. 9. The scan register 15a is formed by an MOS circuit, which comprises a first ratio-type latch circuit 1c, a second ratio-type latch circuit 1d and three N channel transistors 13a, 13b and 13c, similarly to the scan register 15 shown in FIG. 4, and further comprises an exclusive NOR (Ex.NOR) circuit 19, and an NOR circuit 20 and an N channel transistor 13d.

Figure 4:
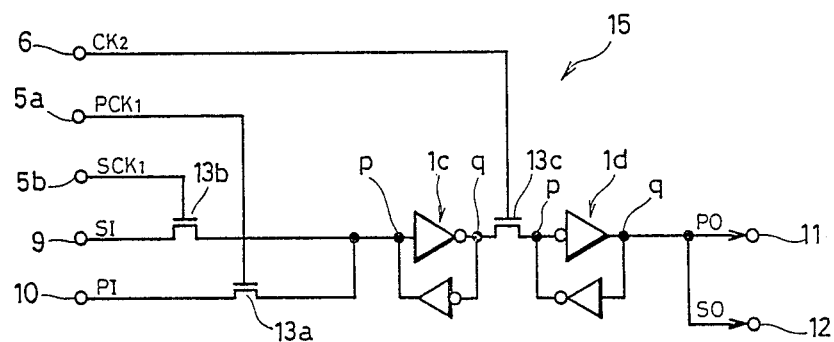
FIG. 4 is a circuit diagram showing structure of each of scan registers constituting the scan-path shown in FIG. 3.
Figure 5:
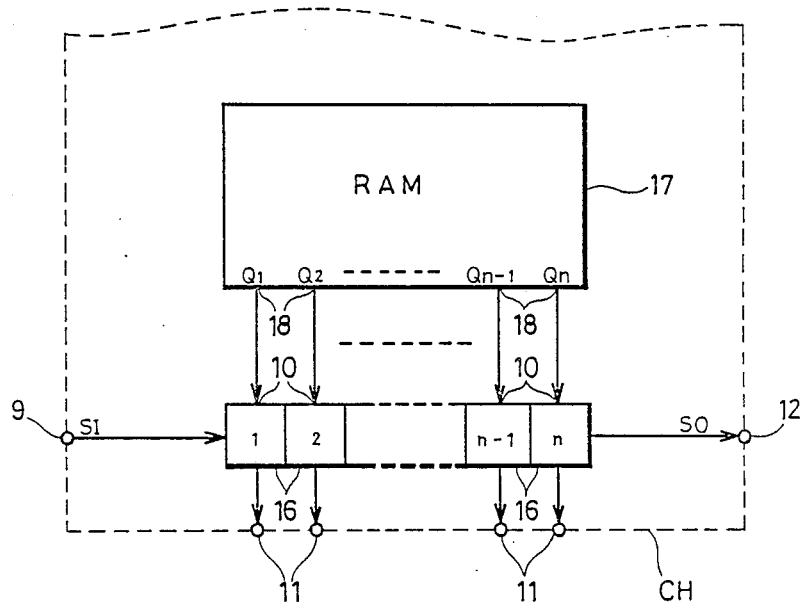
FIG. 5 is a diagram showing a RAM chip comprising the conventional scan-path.

The scan register 15a shown in FIG. 9 is the same as the scan register 15 shown in FIG. 4 except for the following. Therefore, the same or corresponding portions have the same reference numerals. More specifically, the Ex.NOR circuit 19 has one input terminal connected to a parallel input terminal 10, another input terminal connected to an output terminal q of the second ratio-type latch circuit 1d, and an output terminal. The NOR circuit 20 has one input terminal connected to the output terminal of the Ex.NOR circuit 19, another input terminal connected to a test clock terminal 22, and an output terminal. The transistor 13d is connected between an input terminal p of the first ratio-type latch circuit 1c and the parallel input terminal 10, and has its gate connected to the output terminal of the NOR circuit 20.

Description is now made on an operation of the scan register 15a shown in FIG. 9. When a test clock signal $\overline{TCK1}$ is at a high level, an output of an NOR circuit 20 attains a low level, so that a transistor 13d is turned off. Thus, in this case, the scan register 15a performs the same operation as that of the conventional scan register 15 shown in FIG. 4. More specifically, when a clock signal PCK1 is applied to a parallel clock terminal 5a, a transistor 13a is turned on, so that data PI applied to a parallel input terminal 10 is applied to a first ratio-type latch circuit 1c. Contrary to this, when a clock signal SCK1 is applied to a serial clock terminal 5b, a transistor 13b is turned on, so that data SI applied to a serial input terminal 9 is latched in the first ratio-type latch circuit 1c. When a second clock signal CK2 is applied to a second clock terminal 6, data latched in the first ratio-type latch circuit 1c is latched in a second ratio-type latch circuit 1d, and outputted to a parallel output terminal 11 and a serial output terminal 12.

At the time of testing a read operation of the circuit under test, the test clock signal $\overline{TCK1}$ is made to be a low level, and expected value data are set in the first and second ratio-type latch circuits 1c and 1d. If data PI in the parallel input terminal 10 is different from the expected value data held in the second ratio-type latch circuit 1d, the output of the Ex.NOR circuit 19 attains a low level. In this state, when a negative clock signal is applied to the test clock terminal 22, a positive clock signal is outputted from the NOR circuit 20. Consequently, the transistor 13d is turned on, so that the data PI applied to the parallel input terminal 10 is latched in the first ratio-type latch circuit 1c. As a result, the content stored in the first latch circuit 1c is inverted.

Meanwhile, in the first and second ratio-type latch circuits 1c and 1d, data in the input terminal p and data in the output terminal q are inverted to each other. Thus, in the above described case, a value latched on the side of the input terminal p must be employed as a value of data latched on the first ratio-type latch circuit 1c, and a value latched on the side of the output terminal q must be employed as a value of data latched in the second ratio-type latch circuit 1d.

If the data PI in the parallel input terminal 10 is the same as the expected value data held in the second ratio-type latch circuit 1d, the output of the Ex.NOR circuit 19 attains a high level. Consequently, the output of the NOR circuit 20 attains a low level, so that the transistor 13d is turned off. Thus, the state of the first latch circuit 1c does not change.

Figure 3:
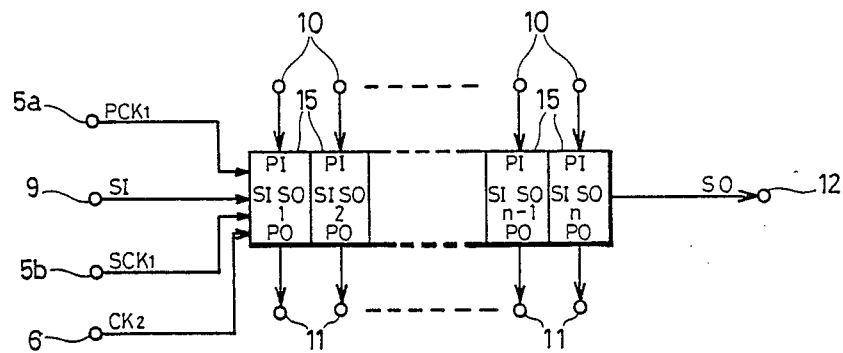
FIG. 3 is a diagram showing another example of the conventional scan-path employed as the text auxiliary circuit.

Thus, when the test clock signal $\overline{TCK1}$ is at a high level, the scan-path shown in FIG. 8 comprising the scan register 15a shown in FIG. 9 performs the same operation as that of the conventional scan-path shown in FIG. 3. More specifically, the scan-path performs a parallel shift operation when the clock signal PCK1 is applied to the parallel clock terminal 5a while performing a serial shift operation when the clock signal SCK1 is applied to the serial clock terminal 5b.

Additionally, when the test clock signal $\overline{\text{TCK1}}$ of a low level is applied to the test clock terminal 22 with the expected value data being set in the scan registers 15a in the scan-path shown in FIG. 8, data held in the scan registers 15a is inverted if data PI applied to each of the parallel input terminals 10 is different from the expected value data. Thus, the scan register 15a stores the fact that the data PI applied to the parallel input terminal 10 is different from the expected value data.

As described in the foregoing, it can be known by the scan-path shown in FIGS. 6 and 8 whether or not different data from the expected value data is applied to the parallel input terminal 10. For example, if the circuit under test is a RAM and particularly, the scan-path according to the above described embodiments is connected to the data output terminals of the RAM, the marked effect is obtained.

Figure 10:
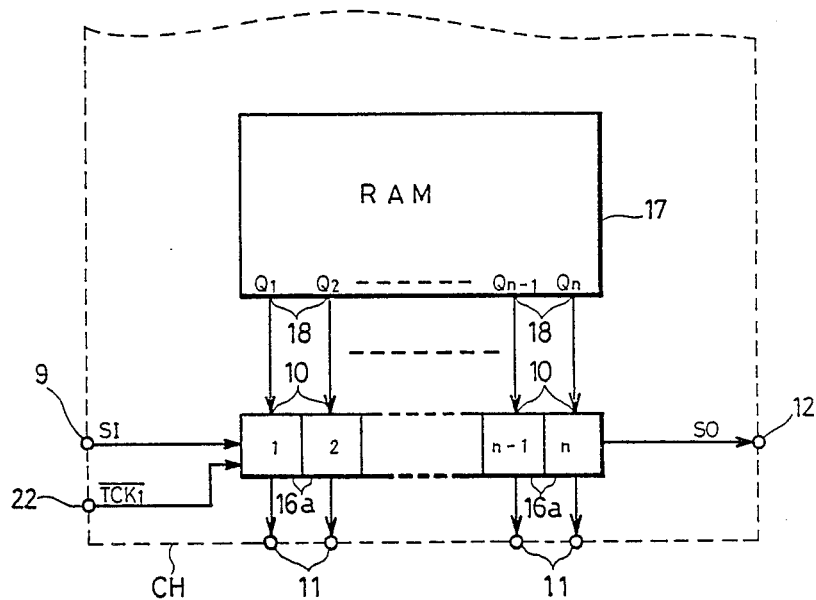
FIG. 10 is a diagram showing a RAM chip comprising the scan-path according to the embodiments of the present invention.

FIG. 10 is a diagram showing an example of a case in which a scan-path is connected to data output terminals 18 of the RAM.

The scan-path comprises n scan registers 16 connected in series. Each of the scan registers 16a corresponds to the scan register 14a or 15a shown in FIGS. 6 to 9. A parallel input terminal 10 of each of the scan registers 16a is connected to a corresponding data output terminal 18 of an RAM 17. The scan-path is formed on the same semiconductor chip CH as that on which the RAM 17 is formed. In FIG. 10, the first and second clock terminals 5 and 6 or the parallel and serial clock terminals 5a and 6a and the second clock terminal 8 are omitted.

At the time of testing the RAM 17, the same data (data "0" or "1") are written to all addresses in the RAM 17 from a data input terminal (not shown). The data as written are read out from the output terminal 18. If the RAM 17 is normal, the same data are continuously read out.

Expected value data are set in the scan-path from a serial input terminal 9 by a serial shift operation. The expected value data are data to be read out from the RAM 17 if the RAM 17 is normal. For example, if data "1" are written to all the addresses in the RAM 17, the expected value data are "1". Thereafter, every time data is read out from the RAM 17, a test clock signal $\overline{\text{TCK1}}$ is applied to a test clock terminal 22. On this occasion, if different data from the expected value data is applied to the parallel input terminal 10 because the RAM 17 is defective, an internal latch of the scan register 16a to which the different data is applied is inverted. Thus, the test clock signal $\overline{\text{TCK1}}$ is applied to the test clock terminal 22 with data being read out from the RAM 17. After data of all the addresses in the RAM 17 are read out, data in the scan-path are read out from a serial output terminal 12 by the serial shift operation. If any of data extracted from the scan-path is inverted, it is determined that any of the addresses in the RAM 17 is defective.

As described in the foregoing, if the scan-path according to the above described embodiments is employed, output data $Q_1$ to $Q_n$ from the RAM 17 need not be read out for every address by the serial shift operation, so that it is necessary to perform the serial shift operation only when expected value data are first written to the scan-path and finally data in the scan-path are read out.

Although in the above described embodiments, description was made of a case in which the circuit under test is an RAM, it is not limited to the same. For example, the test auxiliary circuit according to the present invention may be applied to a circuit which continuously outputs same data "0" or "1", to obtain the marked effect.

Additionally, although the N channel transistors 13a to 13d are employed as the scan registers shown in FIG. 9, P channel transistors may be employed. In addition, the ratio-type latch circuits 1c and 1d may be replaced with latch circuits of another type, to obtain the same effect as that of the above described embodiment.

As described in the foregoing, according to the present invention, at the time of testing the circuit under test, the number of times of serial shift operations required for reading out response data of the circuit under test can be decreased, so that the test cost is reduced, whereby a low cost semiconductor device is obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A test auxiliary circuit employed for testing a semiconductor device, comprising:
   a plurality of data holding means connected in series stages each holding data,
   a plurality of external parallel data input terminals respectively coupled to each data holding means stage,
   an external serial data input terminal coupled to data holding means in a first data holding means stage,
   an external serial data output terminal coupled to data holding means in a final data holding means stage,
   means for transferring data held in each data holding means stage to data holding means in subsequent stages,
   and means for holding data applied to the corresponding parallel data input terminal in place of said data held in the corresponding stage if the data applied to said corresponding parallel data input terminal is different from said data held therein.

2. A test auxiliary circuit according to claim 1, wherein
   each of said data holding means comprises a parallel data input terminal coupled to a corresponding external parallel data input termainal, a serial data input terminal and a data output terminal,
   said serial data input terminal of said data holding means in the first stage being coupled to said external serial data input terminal,
   said serial data input terminal of another data holding means being coupled to said data output terminal of data holding means in the previous stage, and
   said data output termainal of said data holding means in the final stage being coupled to said external serial data output terminal.

3. A test auxiliary circuit according to claim 2, wherein each of said data holding means further comprises a scan register, said scan register comprising
   selecting means for selecting data applied to said external parallel data input terminal or data applied to said serial data input terminal, first and second latch circuits coupled in series between said selecting means and said data output terminal each holding data, and latch enable means for comparing the data applied to said parallel data input terminal with the data held in said second latch circuit and holding the data applied to said parallel data input terminal in said first latch circuit when both are different from each other.

4. A text auxiliary circuit according to claim 3, which further comprises a first clock terminal receiving a first clock signal, a second clock terminal receiving a second clock signal, and a test clock terminal receiving a test clock signal, said latch enable means comprising comparing means for comparing the data applied to said parallel data input terminal with the data latched in said second latch circuit and outputting a predetermined signal when both coincide with each other, and gate means responsive to said predetermined signal from said comparing means and said test clock signal applied to said test clock terminal for transmitting said first clock signal applied to said first clock terminal to said first latch circuit, said first latch circuit being responsive to said fist clock signal from said gate means for latching the data applied to said parallel data input terminal and outputting the same, said second latch circuit being responsive to said second clock signal applied to said second clock terminal for latching the data outputted from said first latch circuit and outputting the same.

5. A test auxiliary circuit according to claim 4, which further comprises a selecting terminal receiving a selecting signal, said selecting means being responsive to said selecting signal applied to said selecting terminal for selectively applying to said first latch circuit the data applied to said parallel data input terminal or said serial data input terminal.

6. A test auxiliary circuit according to claim 4, wherein said gate means transmits to said first latch circuit said clock signal applied to said first clock terminal when it does not receive said test clock signal.

7. A text auxiliary circuit according to claim 3, which further comprises a first clock terminal receiving a first clock signal, a second clock terminal receiving a second clock signal, and a test clock terminal receiving a test clock signal, each of said scan registers further comprising first switching means coupled between said first latch circuit and said second latch circuit and responsive to said second clock signal applied to said second clock terminal to be rendered conductive, said latch enable means comprising comparing means for comparing the data applied to said parallel data input terminal with the data latched in said second latch circuit and outputting a predetermined signal when both coincide with each other, and second switching means connected between said parallel data input terminal and said first latch circuit and responsive to said predetermined signal from said comparing means and said test clock signal applied to said test clock terminal to be rendered conductive, each of said first and second latch circuits comprising a ratio-type latch circuit comprising two inverter circuits connected in antiparallel.

8. A test auxiliary circuit according to claim 7, which further comprises a parallel clock terminal receiving a parallel shift clock signal, and a serial clock terminal receiving a serial shift clock signal, said selecting means being responsive to said clock signal applied to said parallel clock terminal for applying to said first latch circuit the data applied to said parallel data input terminal and responsive to said clock signal applied to said serial clock terminal for applying to said first latch circuit the data applied to said serial data input terminal.

9. A test auxiliary circuit according to claim 1, wherein each data holding means stage comprises:

a first latch means for holding expected value data, a second latch means for transferring and holding data stored in said first latch means, comparing means for comparing the data held in said second latch means with data applied to said parallel data input terminal, and means for changing the data in said first latch means in response to an indication from said comparing means that the data applied to the said parallel data input terminal is different from the data held in said second latch means.

10. A semiconductor device comprising a test auxiliary circuit on the same chip, comprising:

a semiconductor chip, a semiconductor circuit formed on said semiconductor chip and having a plurality of output terminals, and a test auxiliary circuit formed in said semiconductor chip and employed for testing said semiconductor circuit, said test auxiliary circuit comprising:

a plurality of data holding means connected in series stages each coupled to a respective one of said output terminals of said semiconductor circuit for holding data, a serial data input terminal coupled to the data holding means in a first stage of said plurality of data holding means, and a serial data output terminal coupled to the data holding means in a final stage of said plurality of data holding means, each of said data holding means comprising means for transferring data held therein to the data holding means in subsequent stages, and means for holding data received from a corresponding output terminal of said semiconductor circuit in place of said data held therein if said data received from the output terminal is different from said data held therein.

11. A semiconductor device according to claim 10, wherein said semiconductor circuit comprises a random access memory.

12. A method for testing a semiconductor device employing a text auxiliary circuit comprising a plurality of data holding means connected in series stages each holding data; a plurality of parallel data input terminals respectively coupled to each data holding means stage;

a serial data input terminal coupled to the data holding means in a first data holding means stage; and a serial data output terminal coupled to the data holding means in a final data holding means stage, comprising the steps of:

serially inputting expected value data from said serial data input terminal to said plurality of data holding means, to hold said expected value data, applying data outputted from said semiconductor device to said plurality of parallel data input terminals, holding the data applied to each of said parallel data input terminals in place of said expected value data held in each of said data holding means if the data applied to said parallel data input terminal is different from said expected value data, and outputting the data held in said plurality of data holding means from said serial data output terminal after all the data are outputted from said semiconductor device.

* * * * *